(12) United States Patent
Lin et al.

(10) Patent No.: US 9,543,283 B2
(45) Date of Patent: Jan. 10, 2017

(54) LIGHT EMITTING DIODE PACKAGE AND METHOD FOR MANUFACTURING SAME

(71) Applicant: ADVANCED OPTOELECTRONIC TECHNOLOGY, INC., Hsinchu Hsien (TW)

(72) Inventors: Hou-Te Lin, Hsinchu (TW); Fu-Hsiang Yeh, Hsinchu (TW); Chao-Hsiung Chang, Hsinchu (TW); Pin-Chuan Chen, Hsinchu (TW); Lung-Hsin Chen, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/310,575

(22) Filed: Jun. 20, 2014

(65) Prior Publication Data

US 2015/0054009 A1    Feb. 26, 2015

(30) Foreign Application Priority Data

Aug. 22, 2013    (CN) .......................... 2013 1 03691384

(51) Int. Cl.
*H01L 33/00* (2010.01)
*H01L 25/16* (2006.01)
*H01L 33/48* (2010.01)

(52) U.S. Cl.
CPC .......... *H01L 25/167* (2013.01); *H01L 33/486* (2013.01); *H01L 2224/48091* (2013.01); *H01L 2224/48247* (2013.01); *H01L 2224/48257* (2013.01)

(58) Field of Classification Search
CPC .......... H01L 33/58; H01L 33/54; H01L 33/60; H01L 33/20
USPC ....................................... 257/87–88, 98–100
See application file for complete search history.

(56) References Cited

U.S. PATENT DOCUMENTS

2009/0020778 A1*  1/2009  Noichi ............... H01L 25/167
                                                            257/99

FOREIGN PATENT DOCUMENTS

CN     102856316 A     1/2013
TW     M381178 U      5/2010

* cited by examiner

*Primary Examiner* — Hoa B Trinh
(74) *Attorney, Agent, or Firm* — Zhigang Ma (57) ABSTRACT

An LED packaging includes a substrate having a top surface and a bottom surface opposite to the top surface, a recess defined in the top surface, an LED mounted on the top surface of the substrate, a zener diode received in the recess, and a reflecting layer formed in the recess and enclosing the zener diode therein.

8 Claims, 8 Drawing Sheets

LIGHT EMITTING DIODE PACKAGE AND METHOD FOR MANUFACTURING SAME

FIELD

The present disclosure generally relates to solid state light emitting sources and, more particularly, to a light emitting diode (LED) package and a method for manufacturing the LED package.

BACKGROUND

LEDs have many advantages, such as high luminosity, low operational voltage, low power consumption, compatibility with integrated circuits, easy driving, long term reliability, and environmental friendliness which have promoted the wide use of LEDs as a light source.

A typical LED package includes a substrate, a circuit mounted on a top surface of the substrate, an LED chip and a zener diode electrically connecting the circuit respectively.

However, because the LED chip and the zener diode are arranged on one flat surface of the substrate, the LED chip and the zener diode are often in substantially the same plane. As such, some amount of light emitted from the LED chip will be absorbed by the zener diode, resulting in a decrease of a light output efficiency of the LED package.

Therefore, what is needed, is an LED package and a method for manufacturing the LED package which can overcome the limitations described above.

DETAILED DESCRIPTION

Embodiments of an LED package 100 in accordance with the present disclosure will now be described in detail below and with reference to the drawings.

Figure 1:
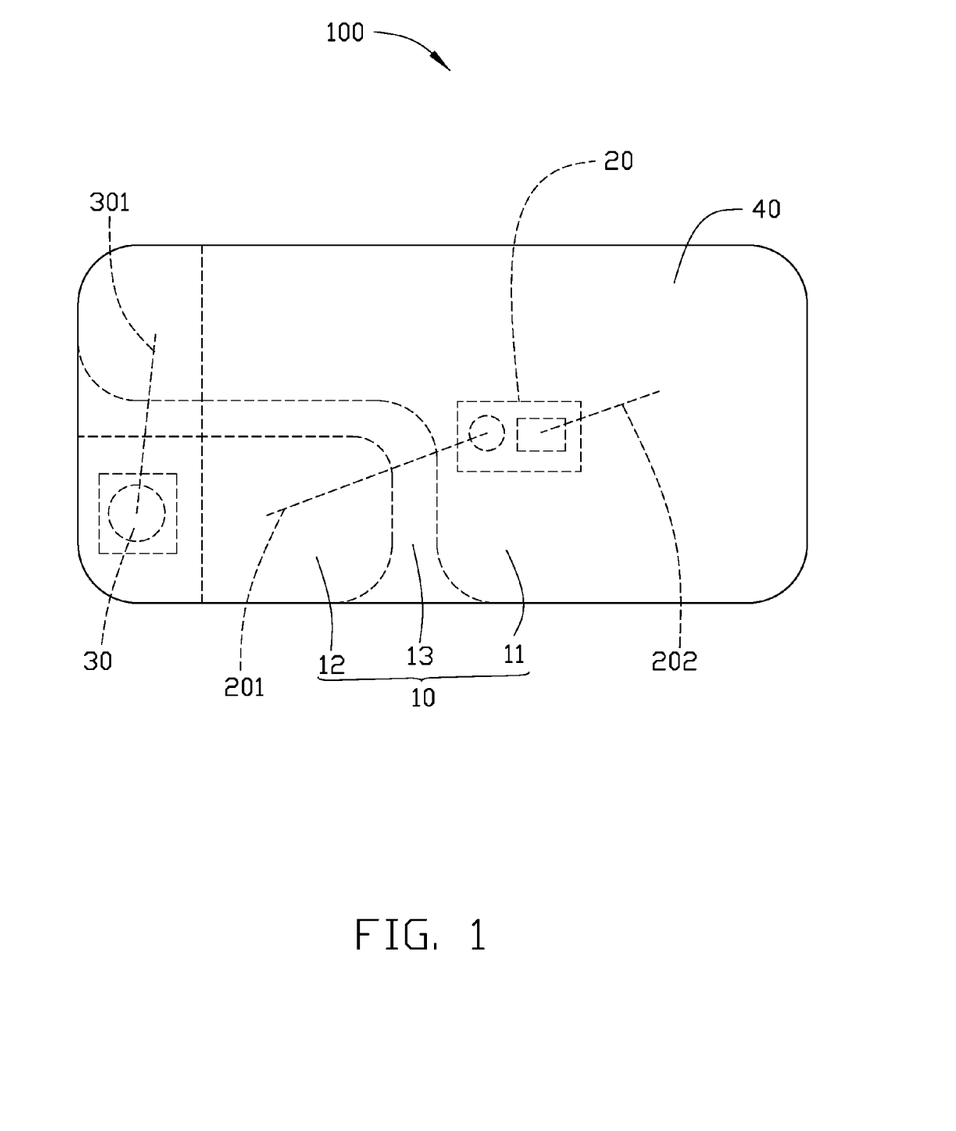
FIG. 1 is a bottom view of an LED package according to an exemplary embodiment of the present disclosure.
Figure 2:
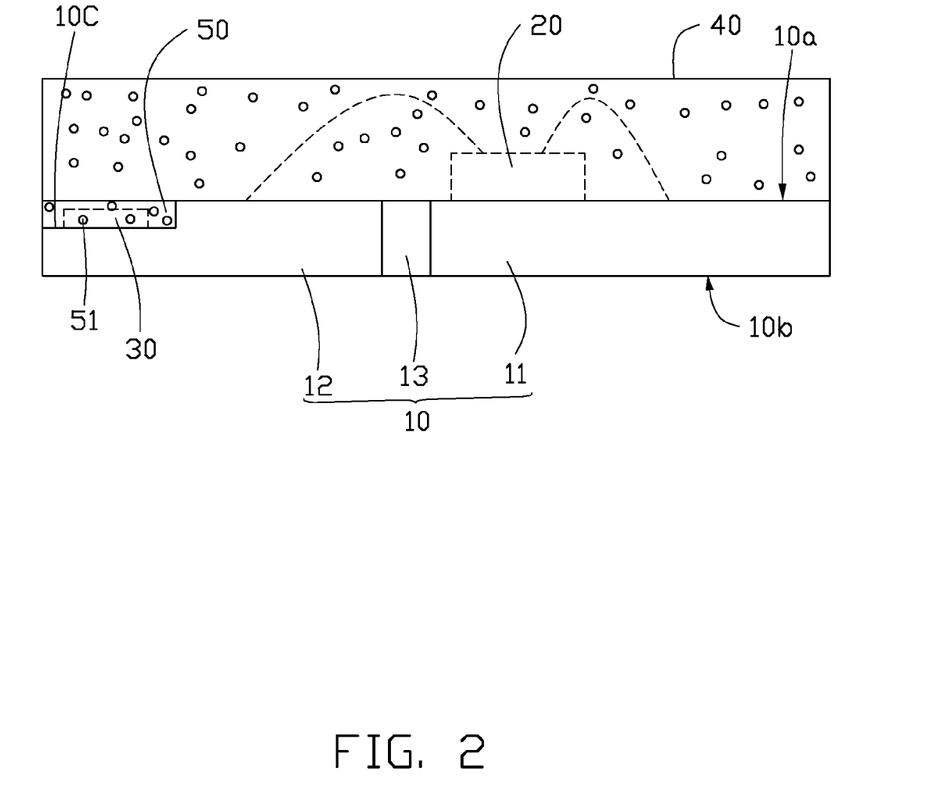
FIG. 2 is a front view of the LED package of FIG. 1.

Referring to FIGS. 1-2, an LED package 100 in accordance with an example embodiment of the disclosure includes a substrate 10, an LED 20 and a zener diode 30 arranged on a top side of the substrate 10, and a packaging layer 40 enveloping the LED 20 and the zener diode 30 therein.

The substrate 10 is cuboidal and includes a first electrode 11, a second electrode 12 and an electrically insulating layer 13. The second electrode 12 is cuboidal and located at a corner of the substrate 10. The first electrode 11 has an L-shaped configuration and is spaced from and surrounds the second electrode 12. The insulating layer 13 is sandwiched between the first electrode 11 and the second electrode 12 to make the first electrode 11 and the second electrode 12 electrically insulate from each other. The insulating layer 13 has an L-shaped configuration. In this embodiment, the first electrode 11 is a p-type electrode and the second electrode 12 is an n-type electrode.

Top surfaces of the first electrode 11, the second electrode 12 and the insulating layer 13 are coplanar and cooperatively form a flat top surface 10a of the substrate 10. Bottom surfaces of the first electrode 11, the second electrode 12 and the insulating layer 13 are coplanar and cooperatively form a flat bottom surface 10b of the substrate 10. A left end of the top surface 10a is recessed towards the bottom surface 10b to define a recess 10c therein. The recess 10c extends through a top portion of the substrate 10 along a width direction of the substrate 10 to expose side parts of the first electrode 11, the second electrode 12 and the insulating layer 13.

The LED 20 is arranged on the top surface of the first electrode 11 and electrically connects the first electrode 11 and the second electrode 12 via wires. The zener diode 30 is received in the recess 10c and electrically connects the exposed side parts of the first electrode 11 and the second electrode 12. A top end of the zener diode 30 is below the top surface 10a of the substrate 10.

A reflecting layer 50 is filled in the recess 10c and envelopes the zener diode 30 therein. The reflecting layer 50 is made of a mixture mixed by opaque glue and a plurality of reflection particle 51 such as TiO2 or SiO2. A top surface of the reflecting layer 50 is coplanar to the top surface 10a of the substrate 10.

The packaging layer 40 is formed on the top surface 10a of the substrate 10 and covers the LED 20 and the reflecting layer 50. The packaging layer 40 is transparent and made of silicon or epoxy resin. In other embodiments, a plurality of phosphorus powder can be doped in the packaging layer 40. The phosphorus powder can be selected from one of garnet, silicates, nitride, nitrogen oxides, phosphide, sulphide or a compound thereof.

In this embodiment, because the zener diode 30 is below the top surface 10a of the substrate 10 and enveloped by the opaque reflecting layer 50, light emitted from the LED 20 is not absorbed by the zener diode 30 and reflected outwardly by the reflecting layer 50. Thus, a light output efficiency of the LED package 100 is improved.

The present disclosure further provides a method for manufacturing the LED package 100 of FIG. 1.

Figure 3:
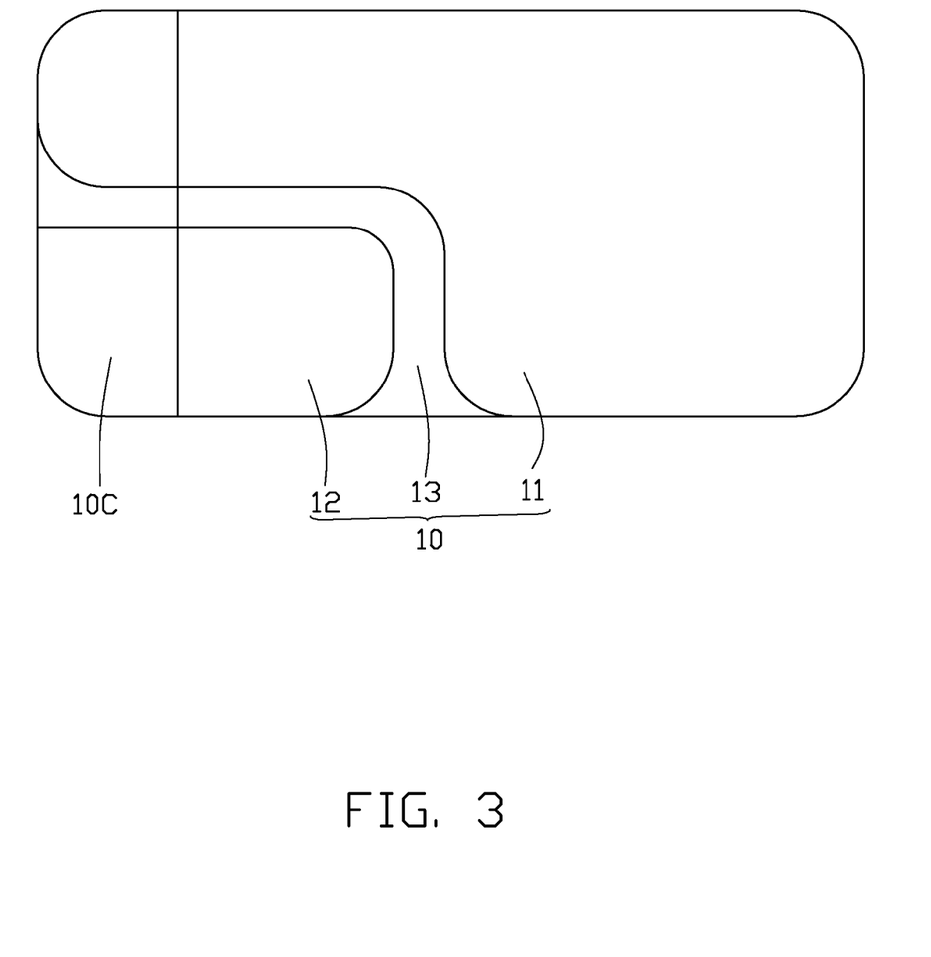
FIGS. 3-8 are schematic views showing the structure obtained by different steps of a method for manufacturing the LED package of FIG. 1.
Figure 4:
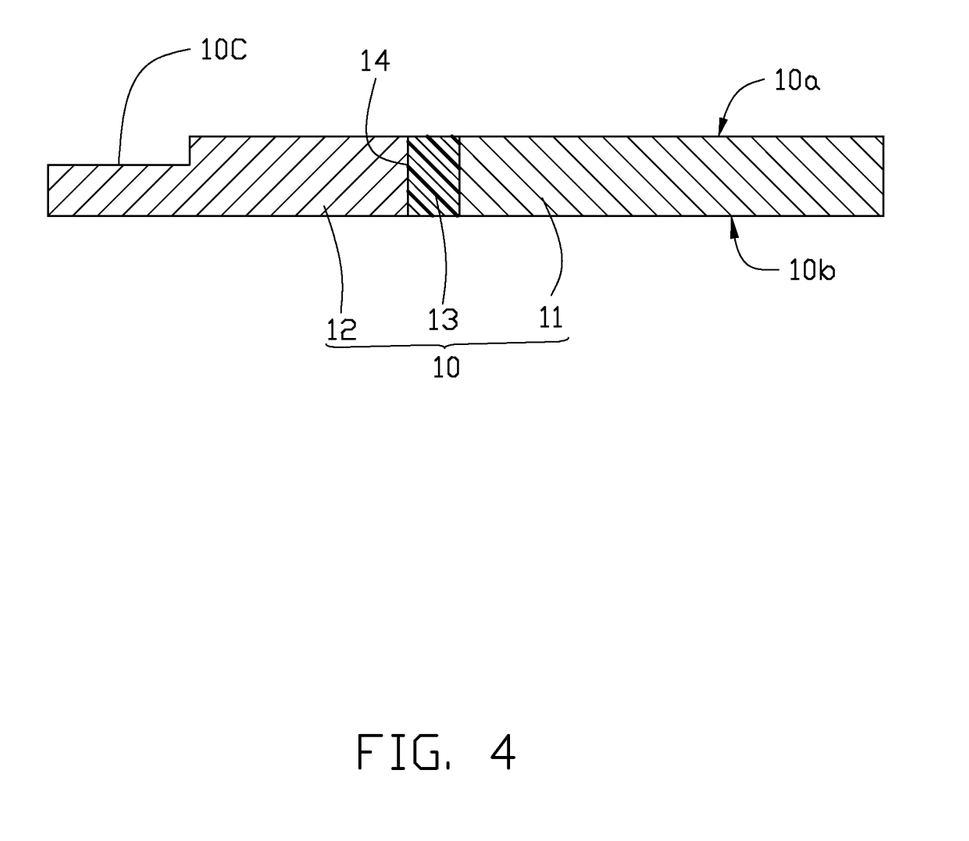

Referring to FIGS. 3-4, in the first step, the substrate 10 is provided, the first electrode 11 and the second electrode 12 are formed by plating or sputtering, and the insulating layer 13 is formed between the first electrode 11 and the second electrode 12 by injecting. The first electrode 11 and the second electrode 12 are formed firstly and a gap 14 is defined between the first electrode 11 and the second electrode 12. When the insulating layer 13 is formed, a plurality of liquid insulating mixture (not shown) is provided. The insulating mixture is filled in the gap 14 and solidified to obtain the insulating layer 13. The left end of the substrate 10 is etched to define the recess 10c Referring to FIGS. 5-6, in the second step, the LED 20 is provided and arranged on the top surface of the first electrode 11. The LED 20 electrically connects the first electrode 11 and the second electrode 12 via the wires.

Figure 5:
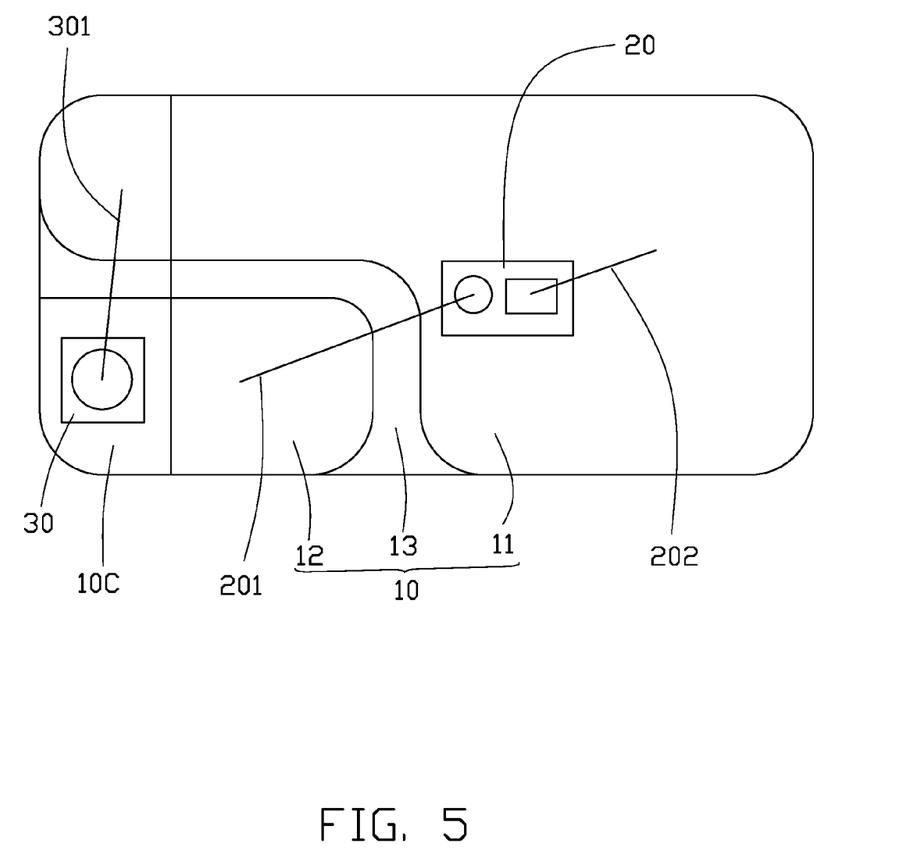
Figure 6:
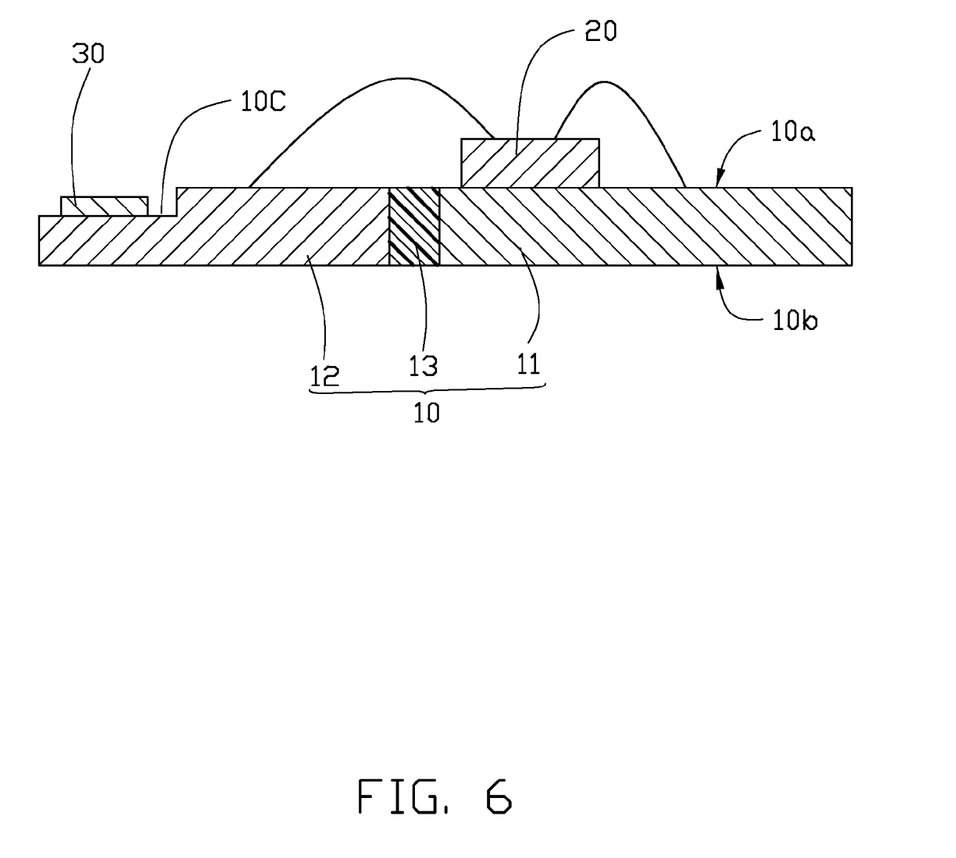

Also referring to FIGS. 5-6, in the third step, the zener diode 30 is arranged in the recess 10c.

Figure 7:
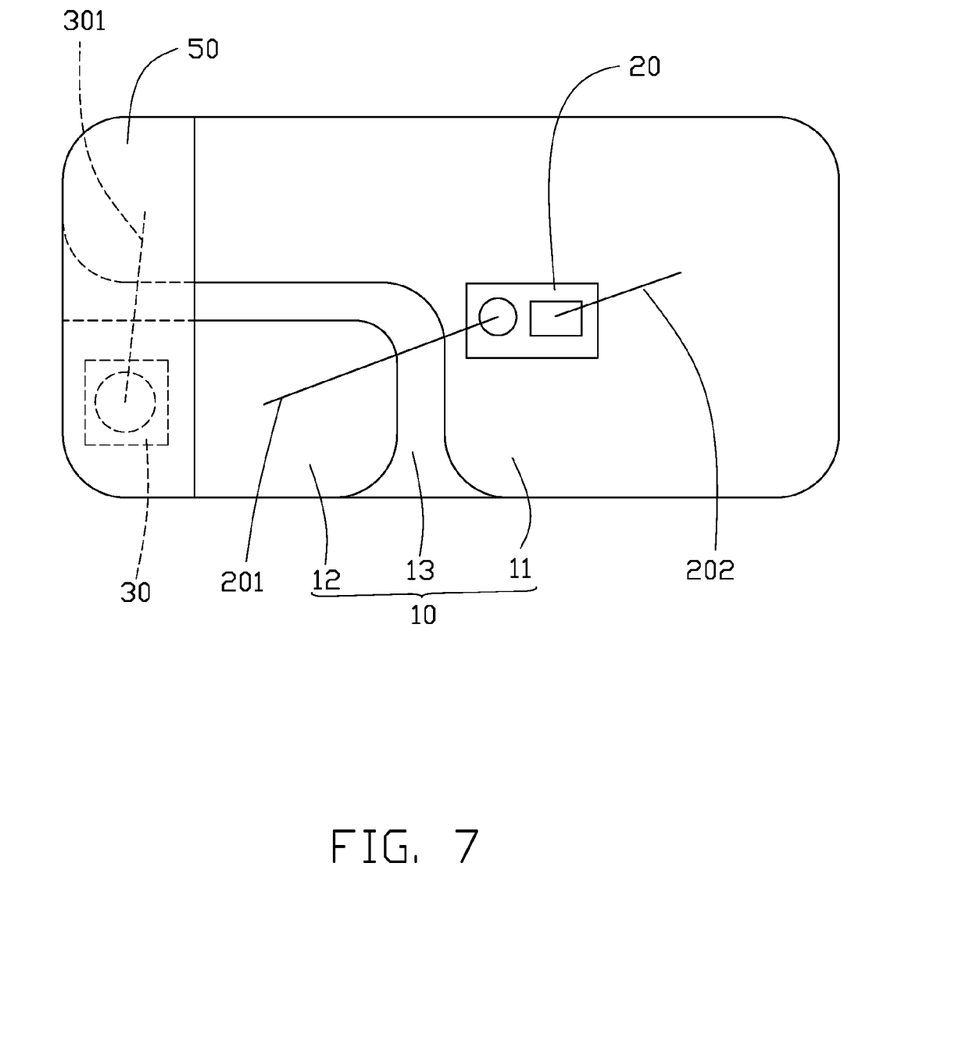
Figure 8:
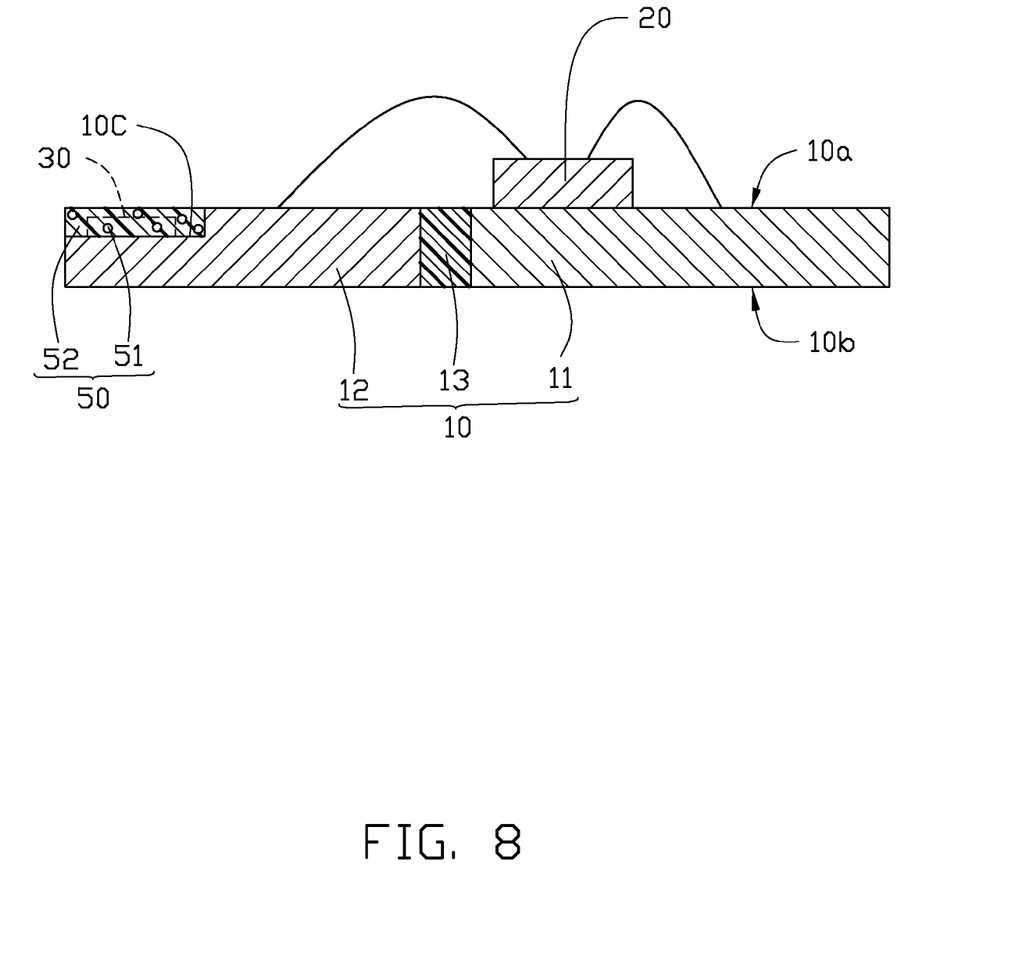

Referring to FIGS. 7-8, in the fourth step, a mixture mixed by glue 53 and the reflection particle 51 is filled in the recess 10c and dried to obtain the reflecting layer 50.

Referring to FIGS. 1-2 again, in the fifth step, the packaging layer 40 is formed on the top surface 10a of the substrate 10.

It is to be further understood that even though numerous characteristics and advantages of the present embodiments have been set forth in the foregoing description, together with details of the structures and functions of the embodiments, the disclosure is illustrative only, and changes may be made in detail, including in matters of shape, size, and arrangement of parts within the principles of the disclosure to the full extent indicated by the broad general meaning of the terms in which the appended claims are expressed.

What is claimed is:

1. A light emitting diode (LED) packaging comprising:
   a substrate having a top surface and a bottom surface opposite to the top surface, a recess defined in the top surface;
   an LED mounted on the top surface of the substrate;
   a zener diode received in the recess; and
   a reflecting layer formed in the recess and the reflecting layer enclosing the zener diode therein;
   wherein the substrate comprises a first electrode, a second electrode, the second electrode is cuboidal and located at a corner of the substrate, the first electrode has an L-shaped configuration, the zener diode is arranged on the second electrode and electrically connects the first electrode and the second electrode.

2. The LED package of claim 1, wherein an insulating layer is sandwiched between the first electrode and the second electrode.

3. The LED package of claim 2, wherein the substrate is cuboidal, the insulating layer has an L-shaped configuration to insulate the first electrode and the second electrode.

4. The LED package of claim 3, wherein the recess extends through a top portion of the substrate along a width direction of the substrate to expose part of the first electrode, the second electrode and the insulating layer.

5. The LED package of claim 3, wherein the LED is mounted on the first electrode and electrically connects the first electrode and the second electrode via wires.

6. The LED package of claim 1, wherein a top surface of the reflecting layer is coplanar with the top surface of the substrate.

7. The LED package of claim 1, wherein the reflecting layer is opaque and comprises reflection particle.

8. The LED package of claim 1, wherein a packaging layer is formed on the top surface of the substrate and covers the LED and the reflecting layer.

* * * * *